United States Patent
Sexauer et al.

(10) Patent No.: US 6,970,111 B1
(45) Date of Patent: Nov. 29, 2005

(54) SAMPLE RATE ADJUSTMENT

(75) Inventors: Edgar Sexauer, Stuttgart (DE); Markus Engelhardt, Dettingen-Teck (DE); Gary Hague, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/860,715

(22) Filed: Jun. 3, 2004

(30) Foreign Application Priority Data

May 7, 2004 (EP) .................................. 04392023

(51) Int. Cl.[7] ............................................. H03M 7/00
(52) U.S. Cl. ...................................... 341/61; 341/144
(58) Field of Search .......................... 341/61, 143, 144; 375/243

(56) References Cited

U.S. PATENT DOCUMENTS

| | | | |
|---|---|---|---|
| 5,600,320 A | 2/1997 | Wilson et al. ............... 341/144 |
| 5,657,261 A * | 8/1997 | Wilson et al. ............... 708/313 |
| 6,201,486 B1 | 3/2001 | Chan et al. ..................... 341/61 |
| 6,215,423 B1 * | 4/2001 | May et al. ...................... 341/61 |
| 6,531,975 B1 | 3/2003 | Trotter et al. ............... 341/144 |
| 6,636,165 B2 * | 10/2003 | Freidhof ....................... 341/61 |
| 2004/0058662 A1 | 3/2004 | Gieske et al ............... 455/313 |

* cited by examiner

*Primary Examiner*—Peguy JeanPierre
(74) *Attorney, Agent, or Firm*—George O. Saile; Stephen B. Ackerman

(57) ABSTRACT

A system and methods to convert a digital bit stream to analog values without previous knowledge of the sample rate of the incoming digital bit stream has been achieved. The system comprises a sample rate measurement device being able to measure the sample rate out of the incoming digital bit stream. Another device is removing all bits, which are not required for the digital to analog conversion from the incoming bit stream. The measured and calculated sample rate is added to the "cleaned" bit stream and a digital to analog conversion device is performing the conversion using the sample rate which has been added to the bit stream.

22 Claims, 4 Drawing Sheets

FIG. 1 - Prior Art

SAMPLE RATE ADJUSTMENT

BACKGROUND OF THE INVENTION (1) Field of the Invention

The invention relates generally to electronic circuit design. More particularly, the present invention relates to the adjustment of sample rates by measuring sample rates of incoming digital bit streams in digital to analog converters.

(2) Description of the Prior Art

Sound is an analog quantity and it has historically been recorded, stored, transmitted and replayed in an analogue way. Obviously, the advent of digital technology has had a huge impact on the audio industry and more of the audio engineering requirements are being realized using digital techniques. It is therefore necessary to be able to convert audio signals between the analog and digital domains.

The block diagram of FIG. 1 prior art illustrates the principal building blocks of a prior art basic digital to analog converter. Normally a bitstream 1 (from CD, tape or transmission) is taken and converted in a digital to analog converter 2 back to an analog signal 3. This is a multi-stage process.

Clock signal input 4 shown in FIG. 1 prior art is used and is associated with the incoming digital data stream so that the digital to analog conversion process is operating at the correct sample rate. The incoming data stream will have some jitter on it, so it is important to eliminate this. A phase locked loop circuit is usually used, which has the effect of maintaining a constant clock at the output, based on the average incoming clock frequency, damping out variations sitter).

In block 5, an input format converter, the arriving digital bit stream must be split up into words, so that the correct bits are combined to make up the correct word. There are many methods of packaging the bits, called framing, to allow additional features like error correction and other non-audio data to be incorporated in the data stream. Obviously, this data must be removed from the audio stream before conversion.

In block 6, a digital to analog block, the digital word is then converted to an analogue sample, using the reverse process to quantization. A digital to analogue converter produces an analog voltage at each sample time. There are a variety of techniques used to achieve this.

There are various patents to describe various embodiments of digital to analog converters:

U.S. patent (U.S. Pat. No. 6,531,975 to Trotter et al.) describes an apparatus and method for converting digital input signals sampled at different rates to analog signals including a digital to analog converter for each digital input signal. Each digital to analog converter receives a digital input signal and a clock signal corresponding to the sampling rate of the received digital input signal. The apparatus can also receive a set of sample rate signals indicating the sampling rate for each digital input signal. The sample rate signals are used to route each digital input signal, along with a corresponding clock signal, to a corresponding digital to analog converter (DAC). A clock error signal controls routing of the digital input signals to the DACs as well as operation of the DACs. A clock divider and ratio detector module generates the clock error signal based on intermediate clock error signals that correspond to the sample rates.

U.S. patent (U.S. Pat. No. 6,201,486 to Chan et al.) discloses how for a system having multiple sources of digital input data to be converted to analog by Digital to Analog Converters (DACs), pre-processing of the multiple sources of data is provided, such that differences in input sampling rates are accommodated. When multiple digital input sources are to be converted to analog signals in a single integrated circuit, these input signals are routed to a clock generator having Phase Locked Loop (PLL) circuitry and to respective Asynchronous Sample Rate Converters (ASRCs). Sample rate information relating to an input signal selected from among the multiple input signals is determined during a locking operation of the PLL. Based on the common clock output from the clock generator, the ASRCs convert the input signals to a single sampling rate. Once the multiple input sources are converted to a common sample rate by the ASRCs, the inputs are converted to analog signals by DACs using the common clock and are output by the single Integrated Circuit.

U.S. patent (U.S. Pat. No. 5,600,320 to Wilson et al.) describes a method and apparatus for digital-to-analog conversion using sigma-delta modulation of the temporal spacing between digital samples are provided. The method and apparatus include sigma-delta modulation of the time-base such that errors produced by non-uniform sampling are frequency-shaped to a high frequency region where they are reduced by conventional filtering techniques. In one embodiment, an oversampling modulator receives digital input samples and, responsive to a noise-shaped clock signal, modulates the digital input samples to produce modulated samples at an oversampling rate. The oversampling rate preferably is equal to an oversampling ratio times a preselected input sample rate. A DAC, coupled to the modulator, converts the modulated samples to an analog signal. A modulator sample rate control circuit, coupled to the modulator, receives a frequency select signal representing the preselected input sample rate, and produces the noise-shaped clock signal for controlling operation of the modulator at the oversampling rate. The control circuit preferably includes a first sigma-delta modulator that sigma-delta modulates the frequency select signal. The oversampling modulator preferably includes a second sigma-delta modulator.

SUMMARY OF THE INVENTION

A principal object of the invention is to convert a digital input stream to analog values being able to perform the conversion without previous knowledge of the sample rate of the incoming digital bit stream.

In accordance with the objectives of this invention, a digital to analog conversion system being able to perform the conversion without previous knowledge of the sample rate of the incoming digital bit stream has been achieved. Said system comprises, firstly, a means to measure the sample rate of the incoming digital bit stream, having an input and an output, wherein the input is a digital bit stream and pulses of a master system clock and the output is an input for a means to calculate the actual sample rate. Furthermore said system comprises a means to remove all bits which are not required for the digital to analog conversion from the incoming bit stream, having an input and an output, wherein the input is a digital bit stream and pulses of a master system clock and the output is an input for a means to calculate the actual sample rate. A means is provided to calculate the actual sample rate of the incoming digital data stream using the measurement result of the means to measure and to add the calculated sample rate to the output of the means to remove bits, having an input and an output. The input is a digital "cleaned" bit stream and the results of the means to measure and the output is an input for a means to convert a digital input stream to analog values. A means is provided to convert a digital input stream to analog values using the sample rate calculated by said means to calculate, having an input and an output, wherein the input is a digital bit stream comprising the actual sample rate and the output are converted analog values.

In accordance with the objectives of this invention, a method for digital to analog conversion being able to perform the conversion without previous knowledge of the sample rate of the incoming digital bit stream has been achieved. Said method comprises, first, providing a digital to analog conversion system, comprising a means to measure the sample rate of the incoming digital bit stream, a means to remove all bits which are not required for the digital to analog conversion from the incoming bit stream, a means to calculate the actual sample rate of the incoming digital data stream, and a means to convert an digital input stream to analog values. Furthermore said method comprises to measure the sample rate of incoming bit stream, to add measured sample rate information to digital bit stream, and to convert digital bit stream to analog values using the information of the sample rate measured.

In accordance with the objectives of this invention, a method for digital-to-analog conversion being able to perform the conversion without previous knowledge of the sample rate of the incoming digital bit stream has been achieved. Said method comprises, firstly, (40) providing a digital-to-analog conversion system, comprising a means to measure the sample rate of the incoming digital bit stream, a means to remove all bits which are not required for the digital-to-analog conversion from the incoming bit stream, a means to calculate the actual sample rate of the incoming digital data stream, and a means to convert a digital input stream to analog values. Furthermore said method comprises (41) to count number $N_{PULSE}$ of system master clock Fmclk pulses between a frame of the incoming bit stream, (42) to multiply NPULSE with scaling factor A according to equation NPSCRAW=A×NPULSE, (43) to build average NPSC of n NPSCRAW values according to equation $$N_{PSC} = \frac{1}{n}\sum_{1}^{n} N_{PSCRAW(n)}$$

and go then to step (45), (44) to remove all bits not required for the digital-to-analog conversion from the digital input stream while steps 41 to 43 are performed. The last steps comprise step (45) to calculate sample rate FSK of digital input stream according to equation $$F_{SK} = \frac{A}{N_{PSC}} \times F_{mclk}$$

and add FSK to the digital input stream "cleaned" in previous step (44), and step (46) to convert digital bit stream to analog values using the information of the sample rate measured.

BRIEF DESCRIPTION OF THE DRAWINGS

In the accompanying drawings, forming a material part of this description, there is shown.

DESCRIPTION OF THE PREFERRED EMBODIMENTS

Figure 1:
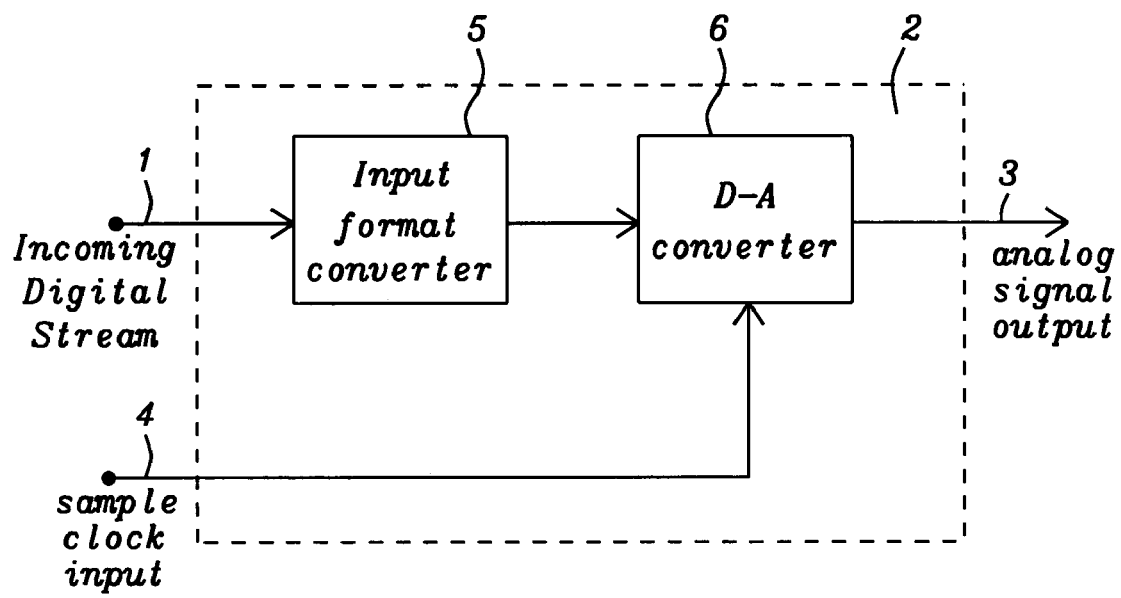
FIG. 1 prior art shows a generic architectural block diagram of a digital to analog converter.
Figure 2:
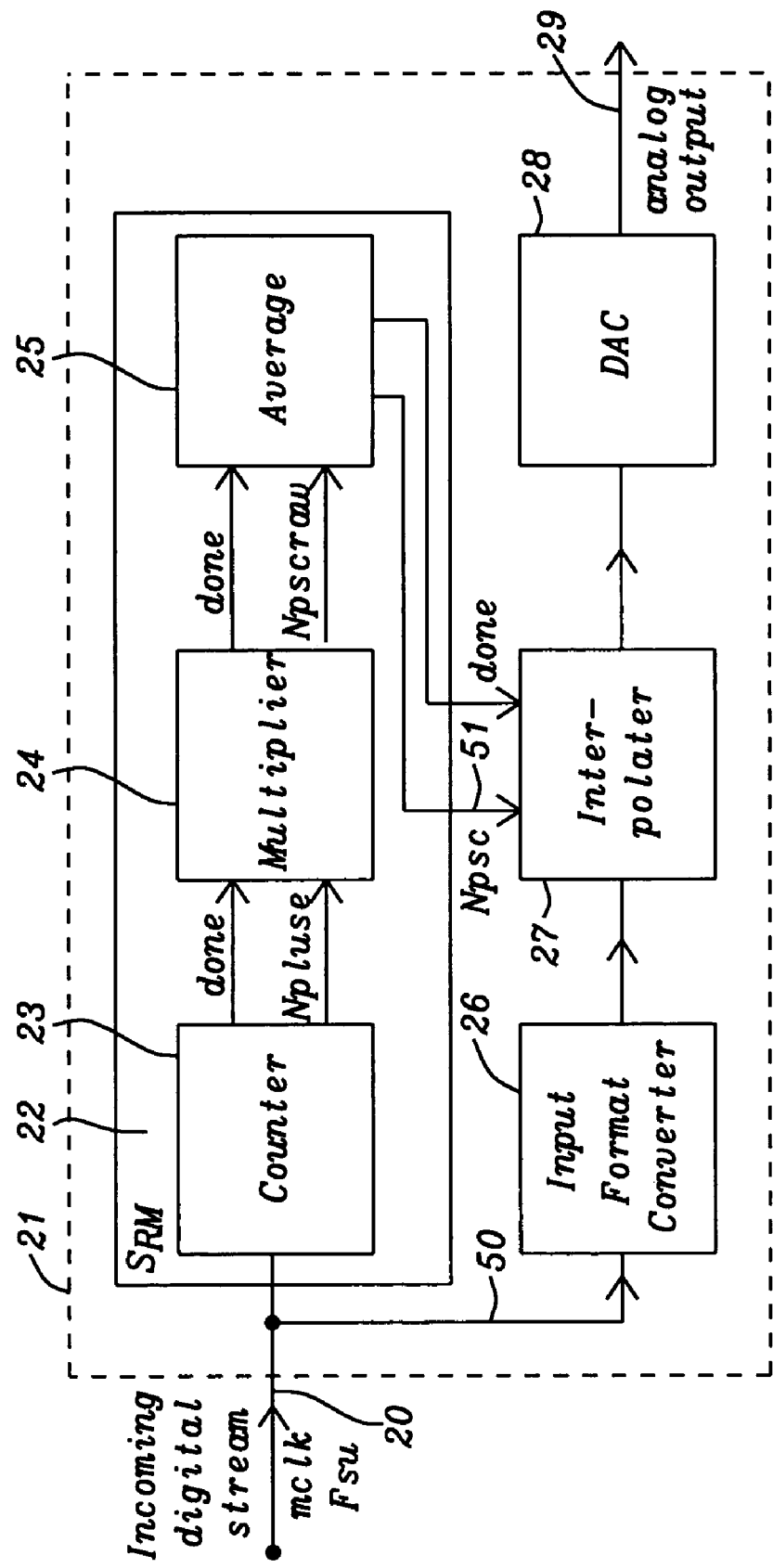
FIG. 2 shows a block diagram of the digital to analog converter invented.

A novel system and novel methods system are herewith described to achieve a novel digital to analog converter. The novel digital to analog converter (DAC) is characterized by measuring the sample rate of the incoming digital bit stream instead of providing a separate clock input that represents the sample rate that is associated with the incoming data stream. This novel method of the present invention is especially advantageous if the sample rate of the incoming bit stream is not known at all or is variable. A communication link from the DAC to the source of the incoming digital bit stream to extract the sample rate of the incoming bit stream is no more required. There is no need for an additional sample clock input as e.g. shown in FIG. 1 prior art FIG. 2 shows a block diagram of the present invention. The incoming bit stream 20 enters the DAC 21. The bit stream has an unknown sample FSU clock. A master system clock (mclk) controls the DAC 21. The novel DAC 21 comprises a sample rate measurement block (SRM) 22, being a key part of the invention. Said SRM 22 comprises a counter device 23, a multiplier device 24 and an average building device 25.

The counter device 23 counts the number Npulse of the pulses pmclk of the master system clock during one FSU cycle or in other words within one frame. The counter device first performs an edge detection for the WAO signal to identify the start and the end of a frame. This is used to initialize the counter after a leading edge detection to trigger the multiplication at the end of one FSU cycle.

The WAO signal is a synonym for the sample rate. It is a clock having the same rate as FSU. WAO is part of the incoming digital stream 20.

The counter device 23 sends a strobe signal "done" to the following multiplier device 24 after the counting of the number NPULSE of pmclk pulses during a complete FSU cycle is completed and transfers then the result NPULSE to the multiplier device 24. The following multiplier device 24 starts when the counter data is ready and multiplies the result NPULSE of the previous step with a defined scaling factor A to get a "raw" scaled count:

$$NPSCRAW = A \times NPULSE \qquad (1)$$

wherein NPSCRAW is a "raw" scaled number of pmclk pulses during a complete FSU cycle, A is a scaling factor and NPULSE is the number of pmclk pulses during a complete FSU cycle. The scaling factor A corresponds to a defined value. The scaling factor A sets the measured sample rate into relation to the master clock.

The chosen implementation uses the scaling factor A to adjust the arithmetic hardware in SRM 22 and in the interpolation block 27 to the range of sampling rates being used. It is chosen for an optimum use of the arithmetic hardware resulting in high accuracy. It should be understood that the system works independently of the value of A.

In a preferred embodiment the multiplier block 24 is carried out in a serial implementation. Using a serial implementation reduces the number of gates significantly. In the application of the present invention there is sufficient time available to utilize a serial implementation.

The multiplier device 24 sends a strobe signal "done" to the following averaging device 25 after the scaled "raw" number NPSCRAW has been calculated and transfers then the result FSU cycle to the averaging device 25. Since the incoming bit stream 20 may have "jitters" in the unknown sample clock, the following averaging device 25 calculates a mean value NPSC out of a number n of "raw" scaled NPSCRAW values:

$$N_{PSC} = \frac{1}{n}\sum_{1}^{n} N_{PSCRAW(n)}, \quad (2)$$

wherein n is the number of the "raw" values of NPSCRAW. The average is taken of values NPSCRAW over n, e.g. 64, WAO cycles and smoothens the output and reduces error due to the limited resolution of the measurement. The averaging device 25 accumulates the results of the multiplication over n, e.g. 64 WAO cycles and calculates the average value. In a preferred embodiment the average is calculated by using shift operations wherein the value of n is following the power of 2 (2, 4, 8, etc.). The remainder of the division is kept in the accumulator in order to prevent an error from building up. Other possible average calculations could be using "moving average" method or an Infinite Impulse Response (IIR) method. The output of the averaging device 25 is zero until the first averaging value has been obtained.

The averaging device 25 sends a strobe signal "done" to the following interpolator device 27 after the mean value NPSC has been calculated and transfers then the result NPSC 51 to the interpolator device 27.

The input format converter 26 receives the digital input bit stream 20 as well via the connection line 50. At the same time as the sample rate measurement 22 described above is measuring and calculating said average value of NPSC 51, the input format converter 26 is removing all bits not required for the digital to analog conversion, e.g. error correction and other non-audio data, from the audio stream before the conversion to analog format, After the input is converted the "cleaned" digital input is sent to the interpolator 27.

The synchronization between the input format converter 26 and the SRM 22 is done by using the incoming sample rate clock via connection line 50 as operating clock. The interpolator uses the extracted clock NPSC 51 from the SRM 22 output The interpolator 27 changes the data rate from the incoming clock 50 to the extracted clock 51 by calculating the actual sample rate according to the equation:

$$F_{SK} = \frac{A}{N_{PSC}} \times F_{mclk}, \quad (3)$$

wherein FSK is the actual sample rate of the digital input stream, A is a scaling factor used in equation, NPSC is a mean value of the scaled number of counts as calculated in equation (2), and Fmclk is the frequency of the master system clock.

The scaling factor A is used to minimize calculation errors in SRM block 22 and in the interpolation block 27.

The interpolator 27 sends the "cleaned" input stream from the input format converter 26 together with the sample rate FSK calculated using equation (3) to the digital to analog conversion device 28. Said conversion device 28 converts the incoming bit stream into analog format.

In a preferred embodiment a DAC 28 with thermometric coding has been used. It should be understood that the system invented works independently of the type of coding, as e.g. with a binary coding.

Figure 3:
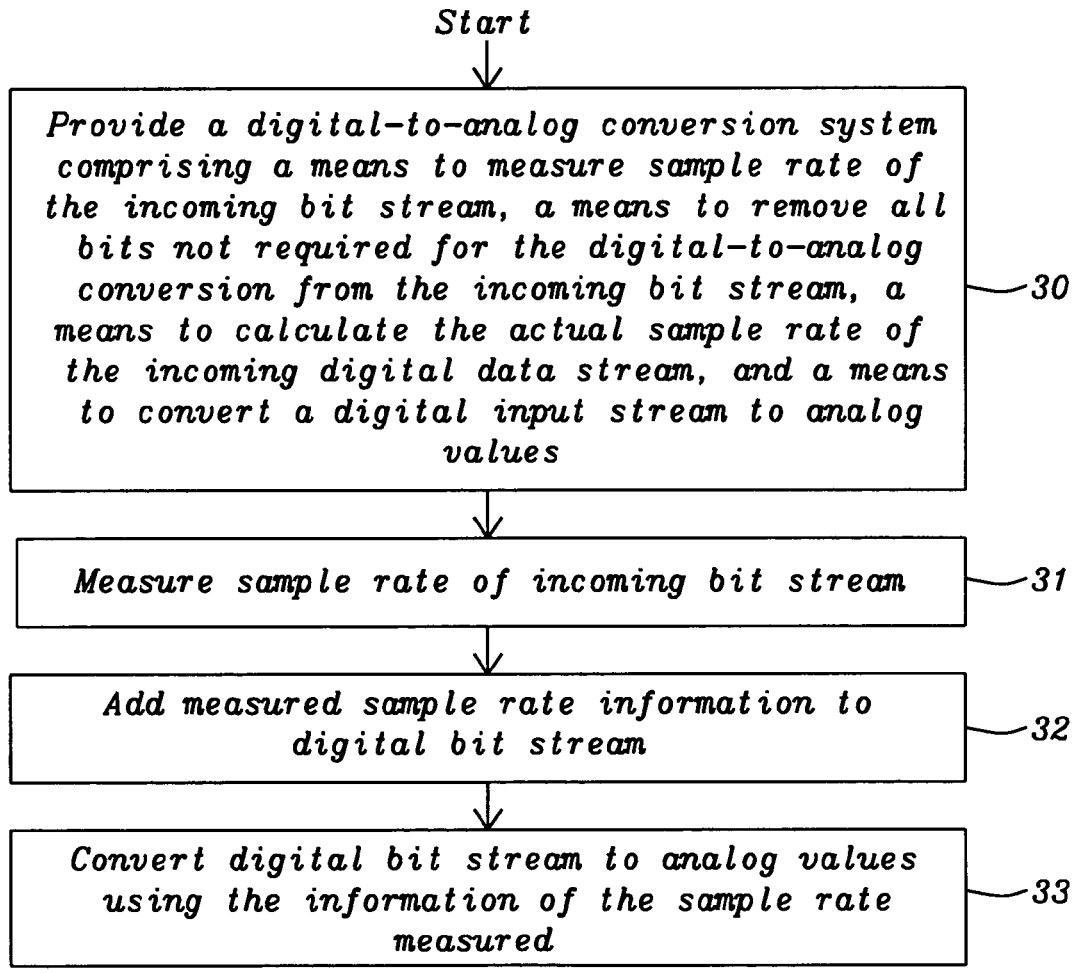
FIG. 3 shows a generic flowchart of a method invented to convert a digital input stream to analog values.

FIG. 3 illustrates a flowchart of the principal steps of the method invented to convert a digital input stream to analog values wherein the sample rate is not known. The first step 30 of the method includes providing a digital-to-analog conversion system, comprising a means to measure the sample rate of the incoming digital bit stream, a means to remove all bits which are not required for the digital to analog conversion from the incoming bit stream, a means to calculate the actual sample rate of the incoming digital data stream, and a means to convert an digital input stream to analog values.

Step 31 describes the measurement of the sample rate of the incoming bit stream. Step 32 illustrates the addition of the measured sample rate information to the digital bit stream and step 33 describes that finally the DAC device converts the digital bit stream to analog values using the information of sample rate measured.

Figure 4:
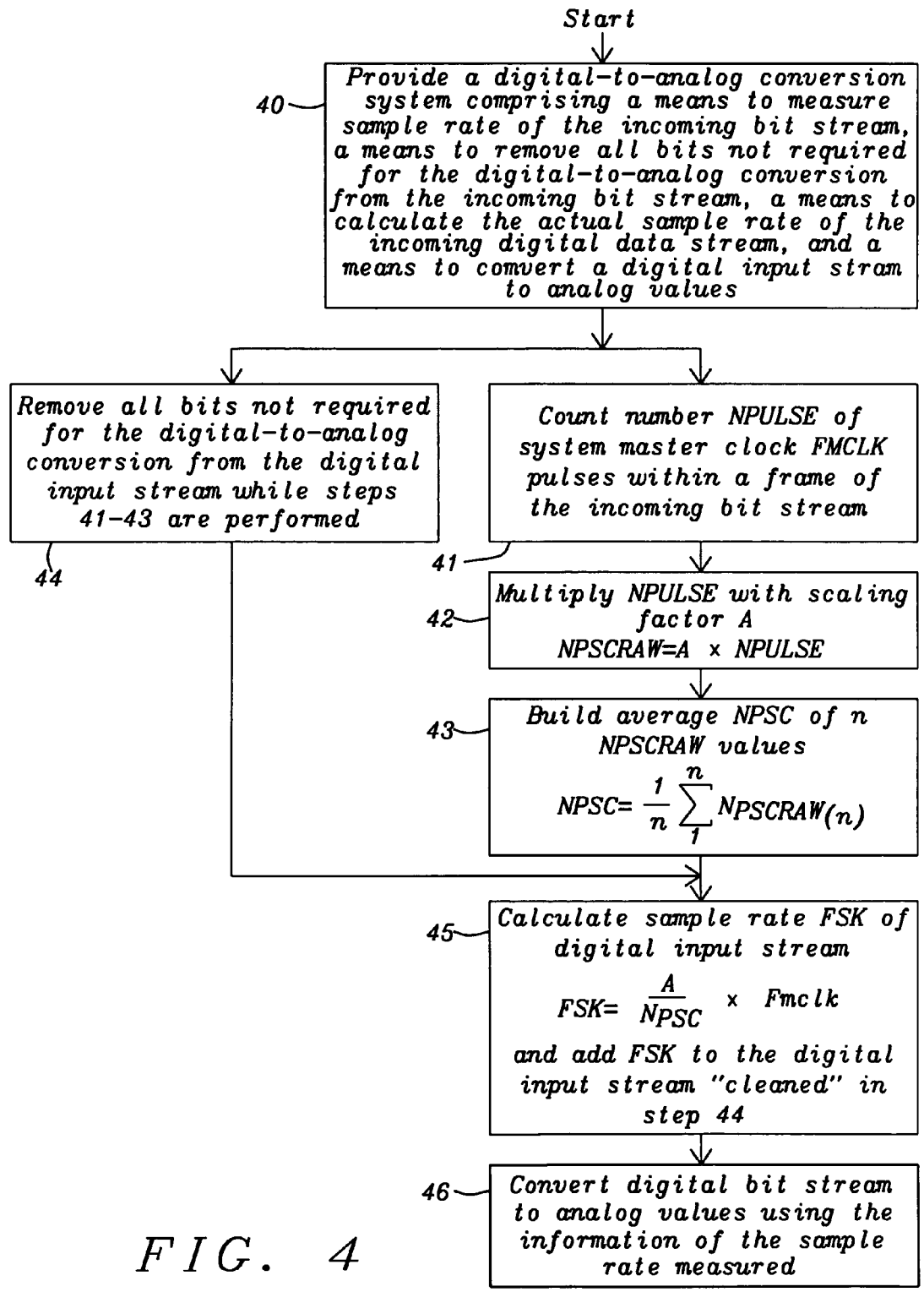
FIG. 4 shows a detailed flowchart of a method invented to convert a digital input stream to analog values.

FIG. 4 describes in more detail the method invented to convert a digital input stream to analog values wherein the sample rate of the digital input is not known. The first step 40 of the method includes providing a digital-to-analog conversion system, comprising a means to measure the sample rate of the incoming digital bit stream, a means to remove all bits which are not required for the digital to analog conversion from the incoming bit stream, a means to calculate the actual sample rate of the incoming digital data stream, and a means to convert an digital input stream to analog values.

Step 41 describes the counting of the number NPULSE of the system master clock Fmclk pulses within a frame of the incoming bit stream. In a preferred embodiment the edges of the WAO signal are used to identify the start and the end of such a frame. Step 42 describes the multiplication of NPULSE with scaling factor A to get a raw value of the pulse count NPSCRAW=A×NPULS. Step 43 describes the calculation of an average value NPSC out of n NPSCRAW values:

$$N_{PSC} = \frac{1}{n}\sum_{1}^{n} N_{PSCRAW(n)}.$$

Step 44 is performed in parallel to steps 41 to 43 and describes the removal ("cleaning") of all bits not required for the digital to analog conversion from the digital input stream while steps 41 to 43 are performed. Step 45 describes the calculation of the actual sample rate FSK of the digital input stream according to the equation $$F_{sk} = \frac{A}{N_{PSC}} \times F_{mclk}$$

and the addition of FSK to the digital input stream "cleaned" in previous step 44. In the last step 46 the digital bit stream is converted to analog values using the information of the sample rate measured.

While the invention has been particularly shown and described with reference to the preferred embodiments thereof, it will be understood by those skilled in the art that various changes in form and details may be made without departing from the spirit and scope of the invention.

What is claimed is:

1. A system for digital to analog conversion being able to perform a conversion of an incoming digital bit stream without previous knowledge of its sample rate is comprising:
    a means to measure a number of master clock pulses during at least one frame of the incoming digital bit stream, having inputs and an output, wherein the inputs are said incoming digital bit stream and pulses of a master system clock and the output is an input for a means to calculate an actual sample rate;
    a means to remove all bits which are not required for the digital to analog conversion from the incoming digital bit stream, having inputs and an output, wherein the inputs are said digital bit stream and said pulses of a master system clock and the output is an input for a means to calculate the actual sample rate;
    said means to calculate the actual sample rate of the incoming digital bit stream and to add said calculated sample rate to the output of said means to remove bits having inputs and an output, wherein the inputs are the output of said means to remove all bits that are not required for the digital to analog conversion, and the results of said means to measure a number of master clock pulses during at least one frame of said incoming digital bit stream and the output, comprising said calculated sample rate added to the output of said means to remove bits, is an input for a means to convert a digital input stream to analog values; and
    said means to convert a digital input stream to analog values using the sample rate calculated by said means to calculate said actual sample rate, having an input and an output, wherein the input is the output of said means to calculate the actual sample rate and the output are converted analog values.

2. The system of claim 1 wherein said means to measure a number of master clock pulses is comprising:
    a counter device having an input and an output, wherein the input is said incoming digital bit stream to be converted to analog format and the output is the number of master clock pulses during a frame of said incoming bit stream;
    a multiplying device having an input and an output, wherein the input is the output of said counter device and the output is said number of master clock pulses during a frame of said incoming bit stream multiplied with a scaling factor; and
    an averaging device having an input and an output wherein the input is the output of said multiplying device and the output is the average number of master clock pulses of more than one frame of said incoming digital bit stream.

3. The system of claim 2 wherein said counter device counts said number of master clock pulses occurring between the edges of a signal indicating the start and the end of a frame within the incoming bit stream.

4. The system of claim 3 wherein said signal indicating the start and the end of a frame is a "Write Adress of time slot 0", (WAO) signal.

5. The system of claim 2 wherein said multiplying device multiplies said number of master clock pulses occurring between the edges of a signal indicating the start and the end of a frame within the incoming bit stream with said scaling factor according to the equation: NPSCRAW=A×NPULS, wherein NPSCRAW is a "raw" scaled number of master clock pulses between the start and the end of a frame, A is a scaling factor and NPULS is the number of master clock pulses provided by said counter device.

6. The system of claim 2 wherein said averaging device calculates an average value of a defined number of scaled number of pulses of the output of said multiplying device according to the equation:

$$N_{PSC} = \frac{1}{n}\sum_{1}^{n} N_{PSCRAW(n)},$$

wherein n is the number of the "raw" values of NPSCRAW being the output of said multiplying device.

7. The system of claim 6 wherein said defined number is a power of 2.

8. The system of claim 6 wherein said averaging device accumulates said defined number of results of said multiplication device and calculates then an average value of the scaled number of pulses of the output of said multiplying device.

9. The system of claim 1 wherein said means to calculate the actual sample rate of the incoming digital data stream is using the equation:

$$F_{SK} = \frac{A}{N_{PSC}} \times F_{mclk},$$

wherein FSK is the calculated actual sample rate of the digital input stream, A is a scaling factor, NPSC is the a mean value of the scaled number of counts, being an output of said means to measure and Fmclk is the unit of the master system clock.

10. The system of claim 1 wherein said means to convert said digital input stream to analog values is a digital-to-analog converter with thermometric coding.

11. The system of claim 1 wherein said means to convert said digital input stream to analog values is a digital-to-analog converter with binary coding.

12. A method for digital-to-analog conversion being able to perform the conversion without previous knowledge of the sample rate of an incoming digital bit stream is comprising:
    providing a digital-to-analog conversion system, comprising a means to measure the sample rate of an incoming digital bit stream, a means to remove all bits which are not required for the digital to analog conversion from said incoming bit stream, a means to calculate the actual sample rate of the incoming digital bit stream, and a means to convert an digital input stream to analog values;
    measure sample rate of incoming bit stream;
    remove all bits not required for digital-to-analog conversion from incoming digital bit stream;

add measured sample rate information to digital bit stream being output of previous step; and convert digital bit stream of previous step to analog values using the information of the sample rate measured.

13. The method of claim 12 wherein said measurement of sample rate comprises count the number NPULSE of system clock pulses within a frame of the incoming bit stream;

multiply NPULSE with a scaling factor A according the equation NPSCRAW=A×NPULS; and calculate average value NPSC out of n NPSCRAW values according to equation:

$$N_{PSC} = \frac{1}{n}\sum_{1}^{n} N_{PSCRAW(n)}.$$

14. The method of claim 13 wherein said frame is identified by edge detection of a "Write Adress of time slot 0" (WAO) signal.

15. The method of claim 13 wherein said average value NPSC is calculated out of n NPSCRAW values using a moving average method.

16. The method of claim 13 wherein said average value NPSC is calculated out of n NPSCRAW values using a Infinite Impulse Response (IIR) method.

17. The method of claim 13 wherein said calculation of the average value is performed by an accumulation of n subsequent values of NPSCRAW followed by an division by n, wherein the remainder of this division is kept in the accumulator in order to prevent an error from building up.

18. A method for digital-to-analog conversion being able to perform the conversion without previous knowledge of the sample rate of an incoming digital bit stream is comprising:

(40) providing a digital-to-analog conversion system, comprising a means to measure the number of master clock pulses during at least one frame of said incoming bit stream, a means to remove all bits which are not required for the digital-to-analog conversion from said incoming bit stream, a means to calculate the actual sample rate of the incoming digital data stream, and a means to convert an digital input stream to analog values;

(41) count number NPULSE of system master clock Fmclk pulses within a frame of the incoming bit stream;

(42) multiply NPULSE with scaling factor A according to equation NPSCRAW= A×NPULSE;

(43) build average NPSC of n NPSCRAW values according to equation $$N_{PSC} = \frac{1}{n}\sum_{1}^{n} N_{PSCRAW(n)},$$

wherein n is the number of frames of said incoming digital bit stream used for averaging and NPSC represents the average sample rate of said n frames;

(44) remove all bits not required for the digital-to-analog conversion from the digital input stream while steps 41 to 43 are performed;

(45) calculate sample rate FSK of digital input stream according to equation $$F_{SK} = \frac{A}{N_{PSC}} \times F_{mclk}$$

and add FSK to the digital output stream of previous step (44), using value of NPSC calculated in step 43; and

(46) convert digital output bit stream of step 45 to analog values using the information of the sample rate measured.

19. The method of claim 18 wherein said frame is identified by edge detection of a "Write Adress of time slot 0" (WAO) signal.

20. The method of claim 18 wherein said calculation of the average value is performed by an accumulation of n subsequent values of NPSCRAW followed by an division by n, wherein the remainder of this division is kept in the accumulator in order to prevent an error from building up.

21. The method of claim 18 wherein said average value NPSC is calculated out of n NPSCRAW values using a moving average method.

22. The method of claim 18 wherein said average value NPSC is calculated out of n NPSCRAW values using a Infinite Impulse Response (IIR) method.

* * * * *